(12) United States Patent
Hower et al.

(10) Patent No.: US 6,878,999 B2
(45) Date of Patent: Apr. 12, 2005

(54) TRANSISTOR WITH IMPROVED SAFE OPERATING AREA

(75) Inventors: Philip L. Hower, Concord, MA (US); John Lin, Chelmsford, MA (US); Sameer Pendharkar, Richardson, TX (US); Steven L. Jensen, Amherst, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/619,699

(22) Filed: Jul. 15, 2003

(65) Prior Publication Data

US 2005/0012148 A1 Jan. 20, 2005

(51) Int. Cl.[7] .................. H01L 29/76; H01L 29/94; H01L 31/062; H01L 31/113; H01L 31/119
(52) U.S. Cl. .................. 257/343; 257/335; 257/341
(58) Field of Search .................. 257/335, 341, 257/343

(56) References Cited

U.S. PATENT DOCUMENTS

| | | |
|---|---|---|
| 4,042,947 A | 8/1977 | Chu et al. |
| 4,231,059 A | 10/1980 | Hower et al. |
| 5,736,766 A | 4/1998 | Efland et al. |
| 6,372,586 B1 | 4/2002 | Efland et al. |
| 2002/0187612 A1 * | 12/2002 | Sleight et al. .............. 438/373 |
| 2004/0056317 A1 * | 3/2004 | Chang et al. ............... 257/390 |

OTHER PUBLICATIONS

"Experimental and Theoretical Analysis of Energy Capability of Resurf LDMOSFETs and Its Correlation with Static Electrical Safe Operating Area (SOA)", Vishnu Khemka, Vijay Parthasarathy, Ronghua Zhu, Amitava Bose and Toss Roggenbauer, IEEE Transactions on Electron Devices, vol. 49, No. 6, Jun. 2002, pp. 1049–1058.

* cited by examiner

*Primary Examiner*—Long Pham
(74) *Attorney, Agent, or Firm*—Yingsheng Tung; Wade James Brady, III; Frederick J. Telecky, Jr.

(57) ABSTRACT

Segmented transistor devices are provided, wherein contiguous individual transistor segments extend along corresponding segment axes, in which two or more of the segment axes are at a non-zero angle with respect to one another. The segmentation of the transistor provides a high overall device aspect ratio which may be easily fit into pre-existing circuit blocks or cells in a device layout, thereby facilitating device scaling.

20 Claims, 9 Drawing Sheets

TRANSISTOR WITH IMPROVED SAFE OPERATING AREA

FIELD OF INVENTION

The present invention relates generally to semiconductor products and more particularly to segmented power MOSFET devices.

BACKGROUND OF THE INVENTION

Power semiconductor products are often fabricated using N or P channel lateral double-diffused metal-oxide-semiconductor (LDMOS) transistors for high power switching applications. For instance, solenoid driver integrated circuits and other output drivers often include one or more such LDMOS power transistor devices along with logic and other lower power analog circuitry, wherein the LDMOS transistors are used to provide control outputs to solenoids in automotive or other applications. LDMOS devices advantageously combine short-channel operation with low on-resistance (Rdson) for high current handling capabilities and are able to withstand large blocking voltages. These devices are thus ideally suited for power switching applications, particularly where inductive loads are to be driven, and have been widely used for integrated circuit output drivers requiring blocking voltages in the range of 20–60 volts, and current carrying capability in the range of about 1–3 amps or higher. In addition, LDMOS device fabrication is relatively easy to integrate into CMOS process flows, facilitating use in devices where logic, low power analog, or other circuitry is also to be fabricated in a single IC.

For power transistors, a given device design is typically a tradeoff between breakdown voltage, on-state resistance, and safe operating area. Breakdown voltage is often measured as drain-to-source breakdown voltage with the gate and source shorted together (BVdss). Where high breakdown voltage is needed, drain-extended MOS transistors are often employed, in which the drain region is spaced from the gate to provide a drift region or drain extension in the semiconductor material therebetween. The spacing of the drain and the gate spreads out the electric fields thereby increasing the breakdown voltage rating of the device. However, the drain extension increases the on-state resistance of the drain-to-source current path Rdson. In conventional drain-extended MOS devices, the Rdson and breakdown voltage are thus generally inversely related, wherein the drain extension causes an increase in Rdson, thus limiting the drive current rating of the device.

The safe operating area (SOA) of a power transistor is a measure of the device's ability to turn off current to a reactive load, such as-a solenoid, without thermal failure or degradation. For a larger device SOA, a larger inductive current can be turned off without damaging the device. For instance, when attempting to turn off drive current to an inductive load such as a solenoid, the voltage across the device is greatly increased while the inductive load prevents the current from decreasing to zero instantaneously. For providing power to capacitive loads, the current through the device is greatly increased while the load prevents the device voltage from decreasing to zero instantaneously. Thermal SOA is a measure of the device size or area needed to accommodate thermal pulses during switching of inductive or capacitive loads, wherein devices that do not satisfy the minimum thermal SOA may suffer thermal degradation or failure during operation.

An ongoing trend in the semiconductor industry involves scaling or reducing the size of semiconductor device features, as product packages are becoming smaller and/or where more circuitry is added to existing package sizes. Such scaling efforts present challenges to transistor device designs, particularly where the design specifications for breakdown voltage, current carrying capability, and/or safe operating area remain the same. Conventional high power device layout techniques separate high and low power circuitry into different locations of a device die, wherein the high power devices are often located near the peripheral die edges to facilitate wiring to external pads. However, such device segregation layout techniques present a limitation on efforts to scale new product designs while still providing the required SOA and Rdson performance. Thus, there remains a need for improved transistor devices to facilitate product scaling without sacrificing SOA and Rdson performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention involves transistor devices which may be employed in semiconductor product designs to facilitate scaling efforts by better utilizing die area in product layout. The invention provides transistor designs with a high effective or overall aspect ratio which allow SOA improvement for a given transistor device area. In addition, the invention provides for partitioning of the transistor into segments to facilitate improved die area utilization without significant redesign or relayout of existing circuit blocks or cells. The invention may thus be advantageously employed to reduce the size of existing products and/or to allow addition of further circuitry to existing devices, while satisfying SOA and on-resistance specifications. The various aspects of the invention may be implemented in association with mixed-signal or other types of semiconductor devices, including but not limited to the exemplary solenoid driver devices illustrated and described hereinafter.

In accordance with an aspect of the present invention, a transistor device is provided, such as an LDMOS, which comprises a plurality of contiguous transistor segments. The individual transistor segments extend along corresponding segment axes, where two or more of the segment axes are oriented at a non-zero angle (e.g., 90 degrees or other) with respect to one another. The segmentation of the transistor allows a fairly high aspect ratio design which may be easily fit into pre-existing circuit blocks or cells, thereby minimizing the effort required to layout an existing product in a reduced die size, wherein two of more contiguous segments are non-coaxial. The individual segments may be of any shape (e.g., curved, straight, or combinations thereof), and one or more of the segments may be of relatively high aspect ratio, to provide an overall or effective aspect ratio for the segmented transistor above 5 or 10. The provision of a high overall aspect ratio may facilitate minimizing the transistor area while still meeting a SOA specification, and thereby aid in scaling an overall product design.

The individual segments may be partitioned into a number of source regions, drain regions, and gate structures which extend laterally from opposite sides of the segment axis, with conductive source and drain interconnect routing structures extending along the direction of the segment axis. Furthermore, the transistor may comprise any number of segments, where the transistor segments may be configured in any contiguous fashion. For instance, an end of a first transistor segment may be located proximate to a portion of a second transistor segment, for example, where the end of the first segment is near an end of the second segment. The invention may be employed in association with LDMOS and other types or transistor devices to facilitate improved space utilization and/or reduced device sizes, while achieving performance and safe operating specifications. In this regard, the various aspects of the invention may be utilized to effectively reduce the total power transistor device areas below that required for equivalent unitary (e.g., non-segmented) devices or transistors of near-unity aspect ratios. In other implementations, the invention may be employed to provide transistors of the same or similar size or area, which have higher power handling capabilities than similarly sized non-segmented transistors or near-unity aspect ratio devices.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
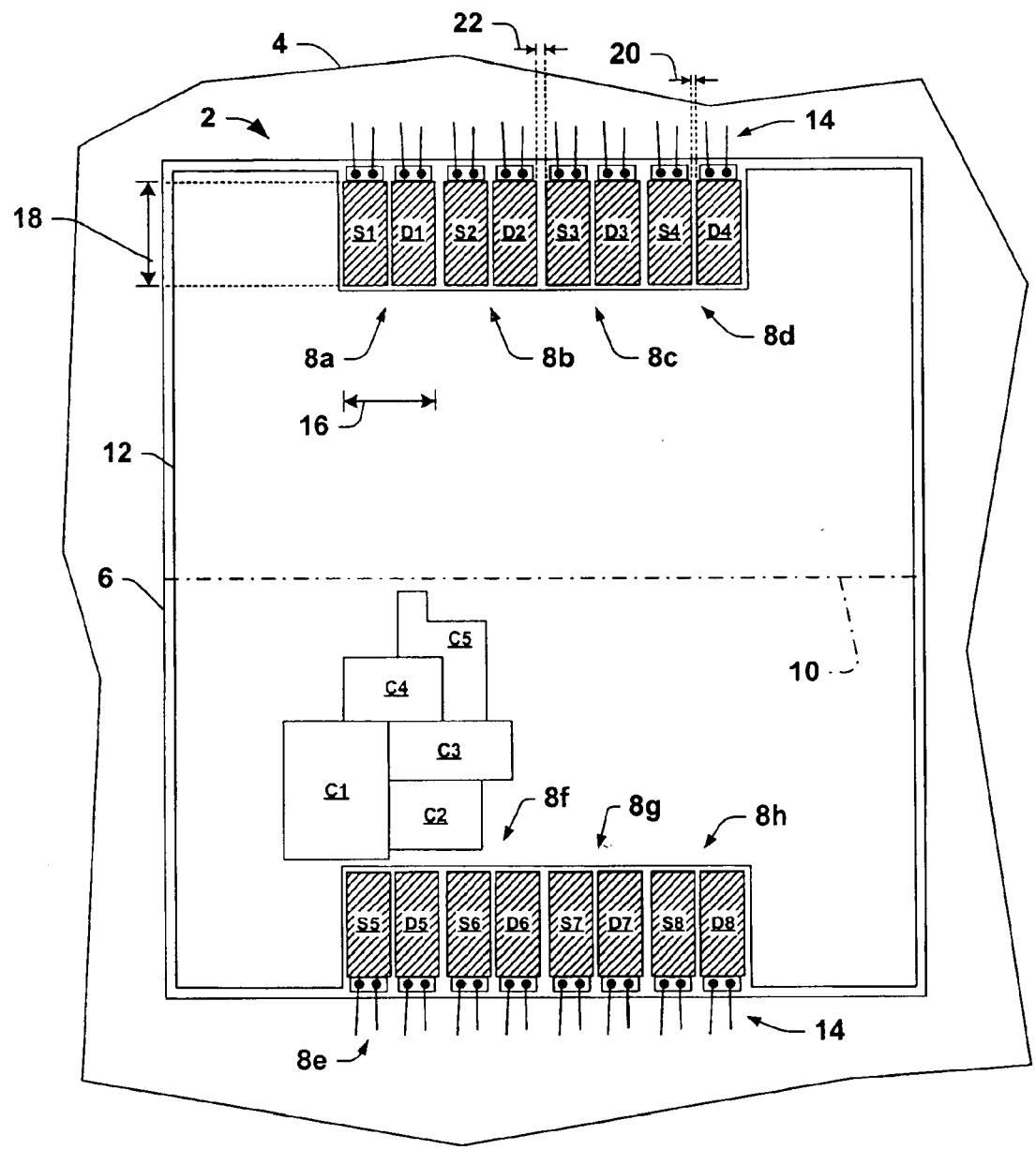
FIG. 1A is a partial top plan view illustrating a solenoid driver device having several near-unity aspect ratio non-segmented power transistor devices together with low-power circuitry located in circuit cells.

The present invention will now be described with reference to the attached drawings, wherein like reference numerals are used to refer to like elements throughout. Several implementations of the various aspects of the invention are hereinafter illustrated and described in the context of LDMOS devices in solenoid driver circuits. However, it will be appreciated that the invention is not limited to such devices, and that the various aspects of the invention may be carried out in conjunction with any type of power semiconductor device, including those having low and high power components, as well as with any type of transistor, including MOS, bipolar, and other transistor types.

Figure 1B:
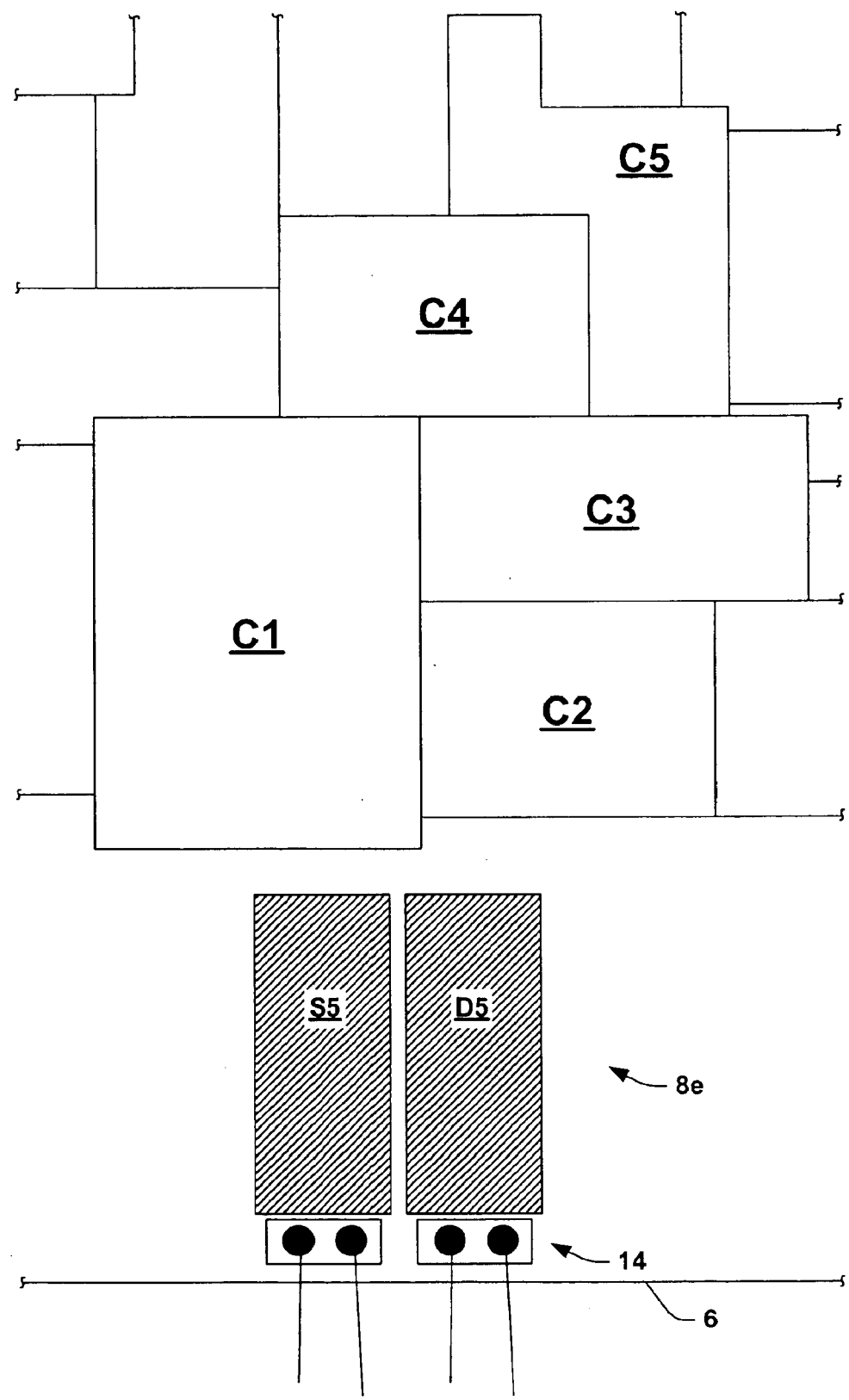
FIG. 1B is a partial top plan view further illustrating the solenoid driver of FIG. 1A and the relative locations of one power transistor and several exemplary low-power circuit cells.

Referring initially to FIGS. 1A and 1B, a solenoid driver device 2 is illustrated during fabrication in a wafer 4 following formation of a top metalization or interconnect layer. The wafer 4 may include many such devices 2, each within a die boundary 6, where the individual devices 2 are separated prior to packaging. The illustrated driver device 2 comprises eight high power LDMOS transistors 8a–8h with four transistors 8a–8d at one end and the other four transistors 8e–8h at an opposite end on either side of a die center-line 10. Other low power analog and digital logic circuitry (not shown) is provided in the remaining portion 12 of the usable area within the die boundary 6. The transistors 8 individually comprise a source metalization region "S" and a drain metalization region "D", for example, wherein the transistor 8a includes a drain metalization region D1 and a source metalization region S1. Each of the transistors 8 also includes a gate (not shown). The drain metalization regions D and source metalization regions S of the transistors 8 are formed over partitioned source and drain diffusion regions (not shown) in the wafer 4, which are connected to the metalization features S and D for external connection to wiring structures (e.g., pads) 14.

As illustrated in FIG. 1B, the wiring pads 14 for the power transistors 8 are located near the edge of the die boundary 6 to facilitate wiring for external connection following die separation. The peripheral location of the power devices 8 leaves the interior regions of the die 6 for lower power circuitry (e.g., low-power analog as well as digital circuits), wherein several exemplary blocks or cells C1–C5 of such low-power circuitry are illustrated in FIGS. 1A and 1B. Certain components or circuitry within some or all of the cells C1–C5 may be more thermally sensitive than others. For example, low-power analog circuits (e.g., op-amps, comparators, bandgap voltage references, etc.) may be more sensitive to temperature pulses from the high-power transistors 8 than are digital circuits. Many circuit blocks or cells, such as microprocessors, A/D converters, etc., may be replicated in more than one product. As a result, such circuit cells C1–C5 and groupings thereof are typically laid-out once, and the cell layout is thereafter reused without significant modification in other product layout designs. Consequently, revising the circuit blocks or cells to accommodate device scaling is costly, wherein reuse of unmodified cell blocks C1–C5 and the relative locations thereof is advantageous.

In the device 2 of FIGS. 1A and 1B, the individual transistors 8 are generally square (e.g., near-unity aspect ratio), with similar rectangular dimensions 16 and 18. The transistor area (e.g., the product of dimensions 16 and 18) is determined by thermal SOA considerations rather than on-resistance requirements for near-unity aspect ratios, due to limitations in the amount of heat that can be dissipated during thermal pulses associated with switching reactive loads such as solenoids. Thus, while a smaller total device area may achieve the desired Rdson performance, the transistors 8 are made physically larger to prevent thermal failure or degradation. Consequently, the near-unity aspect ratio of the transistors 8 presents an obstacle to reducing the size of the driver device 2. Because SOA performance is typically the controlling factor driving the transistor area usage, improving the thermal SOA performance of a power transistor design can lead to reduced transistor area, and thus to reduced die size and die cost.

With respect to the exemplary LDMOS devices 8, the inventors have appreciated that the thermal SOA boundary is reached when the transistors 8 reach a critical temperature, Tcrit, which is in the range of about 450 to 550° C. Device self-heating due to an applied power pulse (e.g., applying or removing power from a solenoid or other reactive load) may cause the transistor 8 to reach or exceed this thermal limit, at which point a parasitic bipolar transistor associated with the LDMOS becomes thermally unstable (e.g., a parasitic npn transistor associated with an n-channel LDMOS). In this regard, the inventors have found that the power density required to reach Tcrit is a function of device area and device shape, wherein the provision of two or three-dimensional cooling operates to increase the power density and thereby to improve the thermal SOA without requiring more total device area. In this regard, a trend has been found, wherein increasing the aspect ratio of the power transistor device area (e.g., away from unity) operates to permit an increased power density for a given area. As a result, high aspect ratio transistor designs may achieve a higher power density for a constant area, and/or the device total area may be reduced for a given power specification. Thus, providing higher aspect ratio transistors facilitates device scaling in semiconductor devices.

Figure 2A:
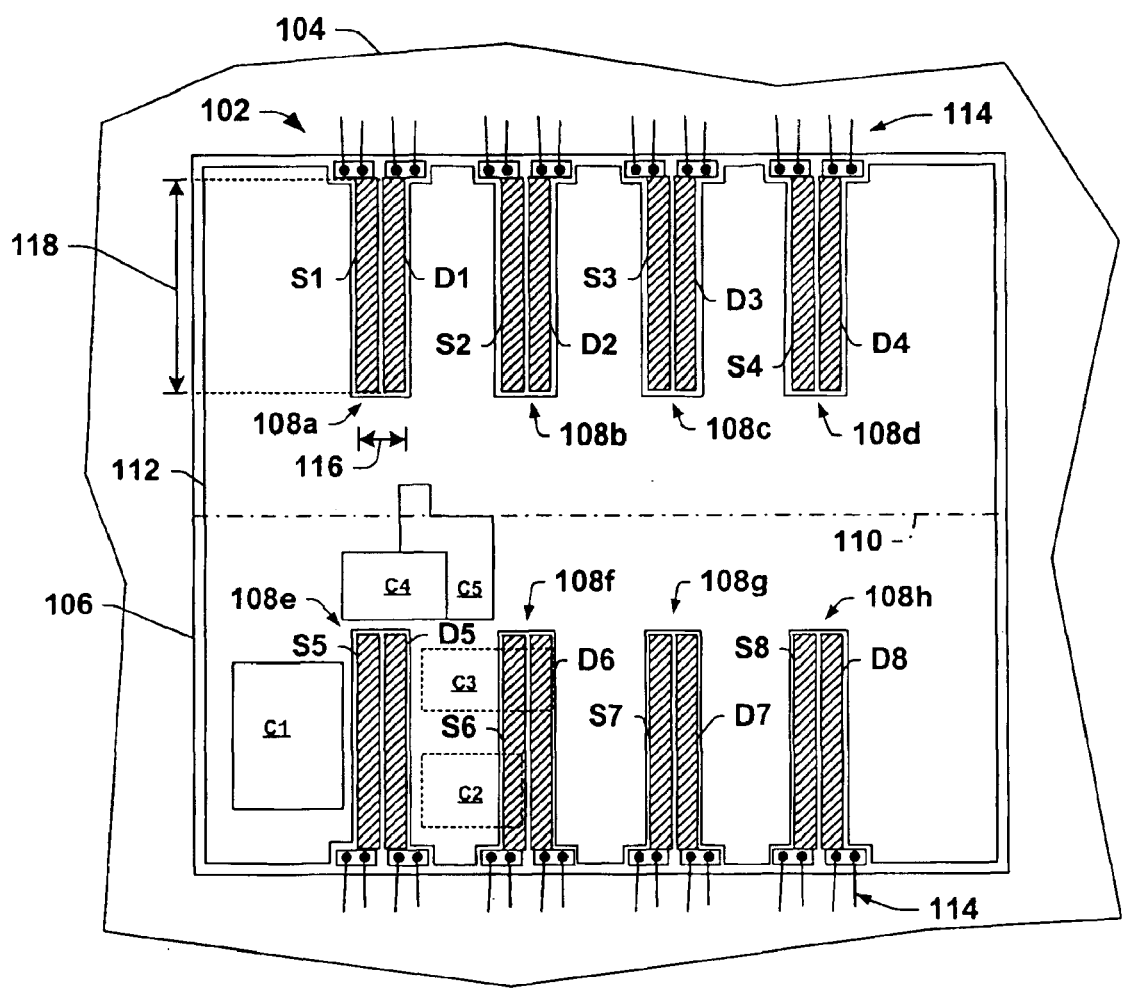
FIG. 2A is a partial top plan view illustrating another solenoid driver device having several higher aspect ratio non-segmented power transistor devices together with low-power circuitry located in circuit cells.
Figure 2B:
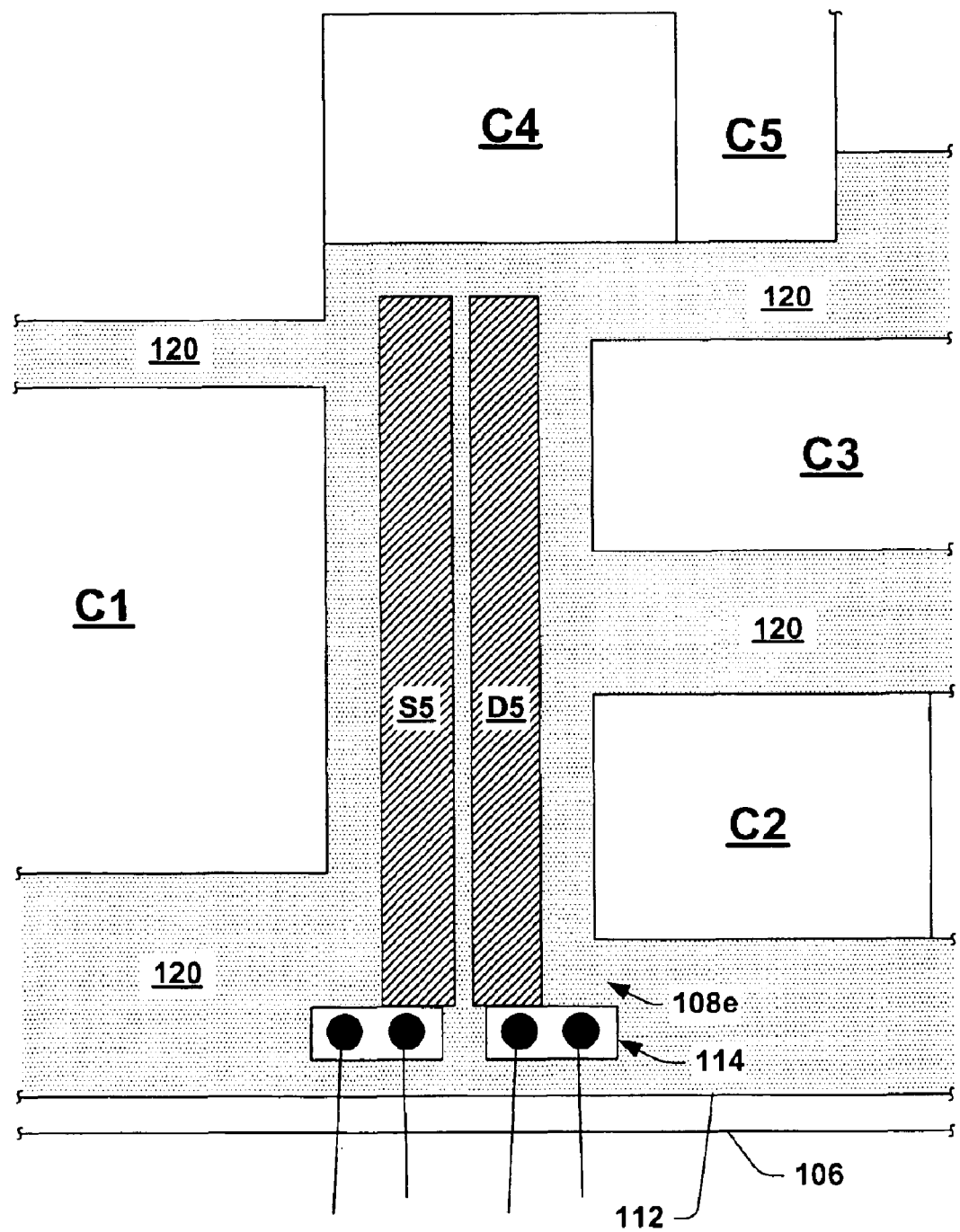
FIG. 2B is a partial top plan view further illustrating the solenoid driver of FIG. 2A and the relative locations of one of the power transistor devices and several exemplary low-power circuit cells.

One possible design approach for scaling the solenoid driver 2 is to simply elongate the LDMOS transistors 8, thereby increasing the aspect ratio. In FIGS. 2A and 2B, and example of this approach is illustrated, wherein a solenoid driver device 102 is fabricated in a reduced die area 106 of a wafer 104. The driver device 102 comprises eight elongated LDMOS transistors 108a–108h with source and drain metalization features S and D coupled to wiring pads 114. The transistors 108a–108h are located in groups of four near the peripheral edges of the die 106 on either side of a die center-line 110, where low-power circuitry (e.g., including the exemplary circuit cells C1–C5) is located in the remaining portion 112 of the space within the die boundary 106. In the device 102, the individual transistors 108 have rectangular dimensions 116 and 118, and are of a total area (e.g., the product of dimensions 116 and 118), which is less than that of the transistors 8 above, while having significantly higher aspect ratios (e.g., the ratio of dimension 118 divided by dimension 116, about 5 in this example).

With respect to thermal SOA, the inventors have found that the higher aspect ratio transistors 108 may provide similar thermal SOA performance, even though having slightly lower total devices areas than the generally square (e.g., near-unity aspect ratio) devices 8 above. In this regard, the inventors have found that more than a factor of two improvement in thermal SOA power density can be achieved if the aspect ratio is increased from 1 to 40, wherein corresponding improvements at various other high aspect ratios are expected to provide similar improvements, thereby allowing reduction in the total transistor area.

However, the inventors have appreciated that the approach of FIGS. 2A and 2B adversely impacts the utility of the remaining area 112 in the device 102. In particular, the longitudinal extension of the transistors 108 forces the circuit cells C1–C5 to be spread out relative to one another, whereby large regions 120 of unused space are created (FIG. 2B). Thus, where the cells C1–C5 are relatively large, merely lengthening the transistors 108 may actually decrease the space utilization (e.g., percentage of useable space) in the area 112 absent redesign of the cells C1–C5. As discussed above, it is desirable to maintain the existing layout/design of the components within the pre-existing cells C1–C5. Additionally, it is often desirable to maintain the relative positioning and orientation of the cells C1–C5 with respect to one another, which the approach of FIGS. 2A and 2B does not allow. Thus, as illustrated in FIG. 2A, the components within the cells (e.g., cells C2 and C3 illustrated in phantom in FIG. 2A) may need to be reconfigured and the relative locations of the cells C1–C5 may be impossible to maintain in the device 102 using the elongated non-segmented transistors 108 in a reduced die area.

Referring now to FIGS. 3A–3F, the present invention provides transistor designs which may achieve high net or effective aspect ratios facilitating reduction in transistor area while maintaining SOA requirements, together with segmentation of the transistor layout to accommodate preexisting circuit blocks or cells in a given product design. In the illustrated implementations below, long, thin (e.g., high aspect ratio) power transistors 208 are placed in an existing mixed-signal layout by slightly displacing previously placed circuit cells or blocks. In such implementations, the invention advantageously facilitates scaling of the power transistors as well as the overall device, with little or no redesign of other circuit cells or blocks.

Figure 3A:
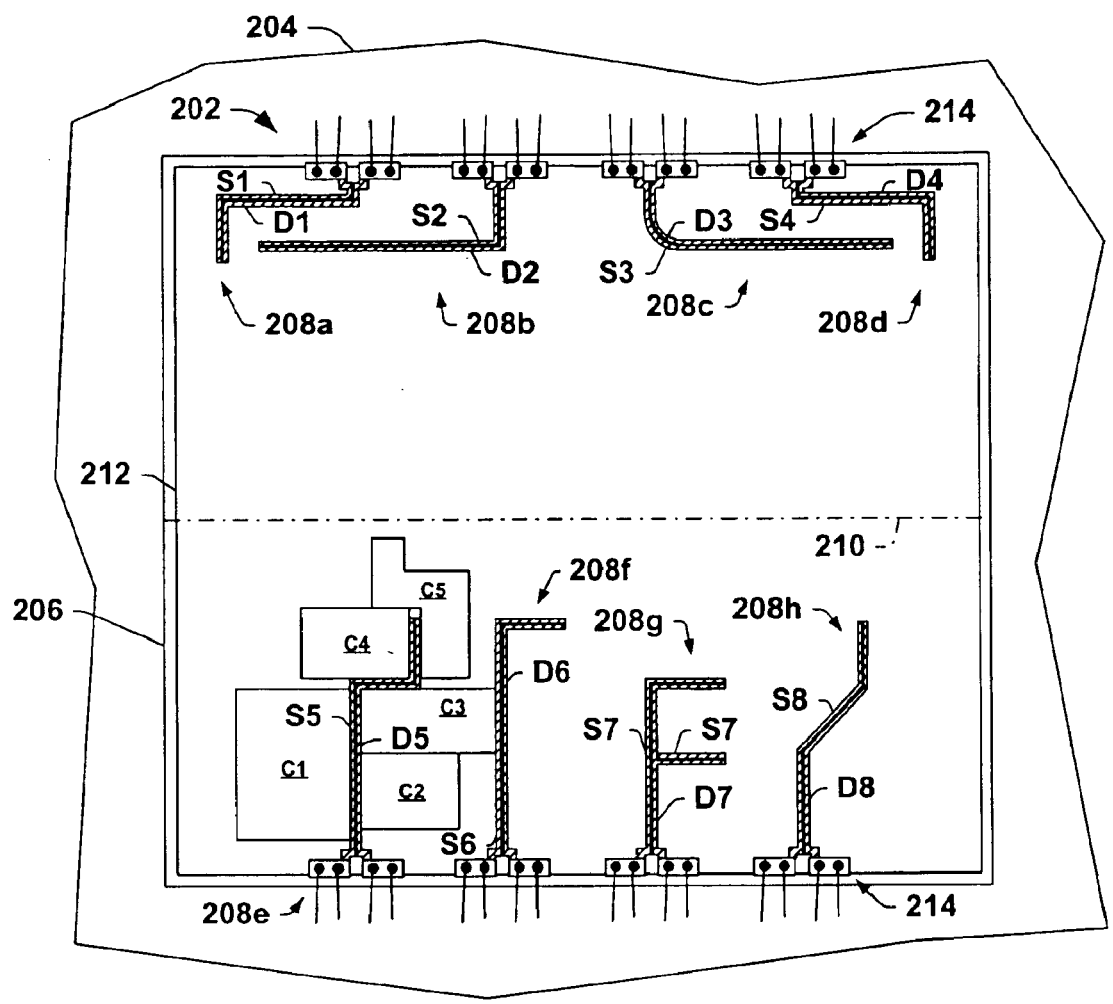
FIGS. 3A–3C are partial top plan views illustrating a solenoid driver device having several exemplary high aspect ratio segmented transistor devices in accordance with the present invention.

FIG. 3A illustrates a solenoid driver device 202 with eight exemplary segmented transistor devices 208 fabricated in a reduced die area 206 of a wafer 204 in accordance with the invention, wherein the die area 206 is roughly divided in two along a center line 210. Upper metalization source and drain interconnect structures are illustrated for coupling the transistors 208 with wiring pads 214 at the periphery of the die area 206. To illustrate several advantageous aspects of the invention, the exemplary pre-existing circuit cells C1–C5 are illustrated in the remaining portion 212 of the space within the die boundary 206 for comparison of the device 202 with the devices 2 and 102 above.

Several examples of segmented LDMOS transistors 208 are illustrated in FIG. 3A, wherein other implementations are contemplated within the scope of the present invention, beyond the specific implementations illustrated and described herein. Thus, the invention is not limited to the exemplary LDMOS transistor devices 208, but rather any type of segmented transistor may be fabricated in accordance with the invention, including but not limited to other MOS transistors and bipolar transistors. The segmented transistor devices of the present invention, such as the transistors 208a–208h, comprise two or more contiguous transistor segments that are non-coaxial. The segments extend along corresponding segment axes, where the axes of two contiguous transistor segments may be perpendicular (e.g., transistors 208a–208g), or may be at any non-zero angle with respect to one another (e.g., transistor 208h).

Furthermore, the segments may be straight (e.g., transistors 208a, 208b, and 208d–208h), or some or all segments may be curvilinear (e.g., transistor 208c). In addition, the transistors 208 as a whole provide for high effective aspect ratios to facilitate device scaling efforts, wherein the individual segments may but need not be high aspect ratio. In this regard, one or more segments may be of unity or near-unity aspect ratio. As illustrated in the exemplary transistors 208a–208h, moreover, the individual segments are contiguous with at least one other segment of a given transistor 208, wherein an end of one segment is proximate to an end or other portion of a second segment, with the overlying conductive source and drain interconnect structures coupling adjacent segments electrically to form the segmented transistors 208. The illustrated example transistors 208 are not exhaustive of the many various implementations possible within the scope of the invention, and all such variants are contemplated as falling within the scope of the appended claims.

Figure 3B:
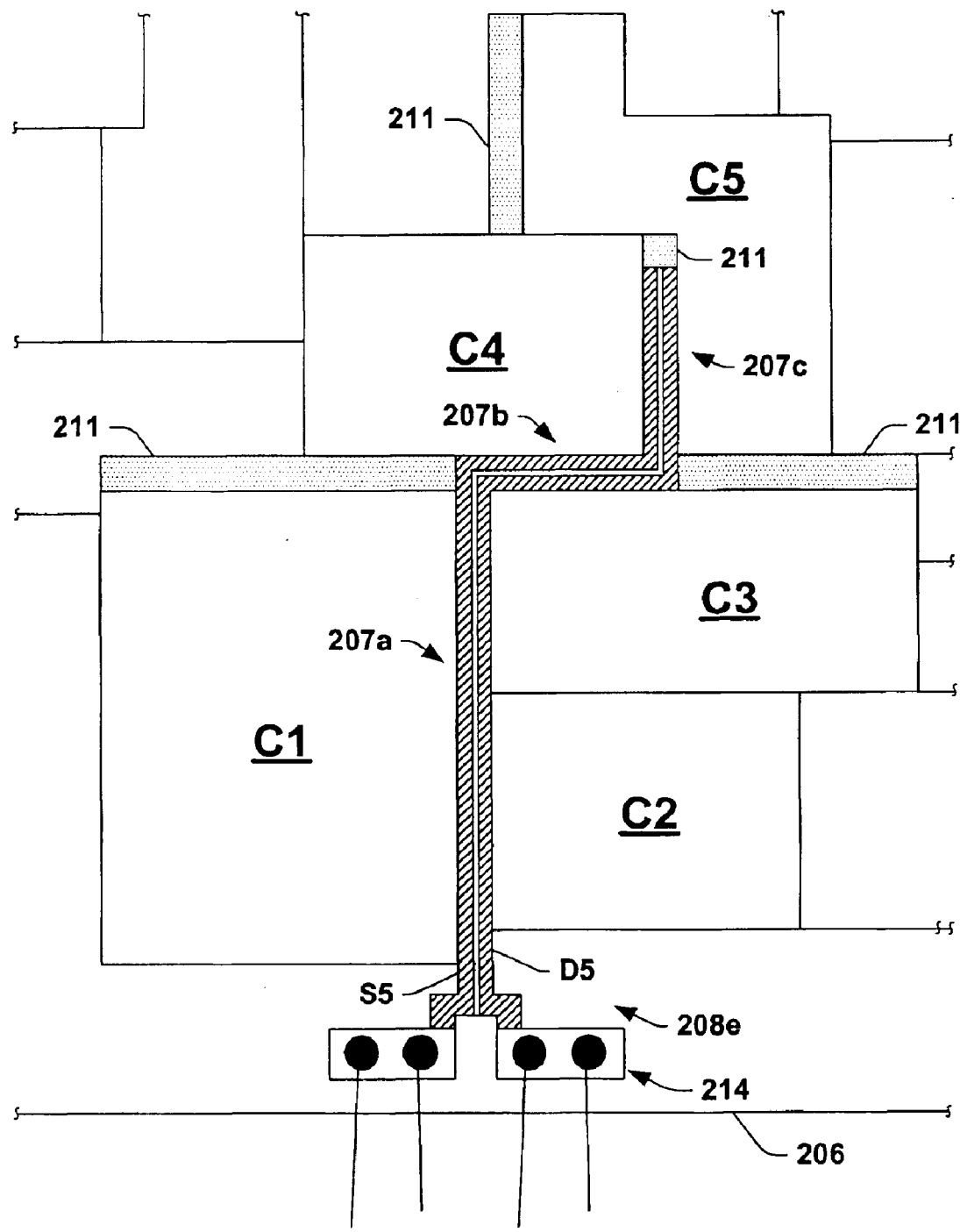

As illustrated in FIGS. 3A and 3B, the transistor segments may advantageously be interspersed between the predefined cells C1–C5 with little or no redesign or relayout of the cells C1–C5, while substantially maintaining the relative location of the cells C1–C5 with respect to one another. Comparing FIGS. 1A and 3A, it is noted that the total die area in the device 202 is smaller than the area of the device 2. In addition, comparing FIGS. 1B and 3B, the segmented transistors 208 facilitate the total device size reduction without necessitating redesign or significant relative relocation of the cells C1–C5.

FIGS. 3B–3F illustrate further details of an exemplary transistor 208e in the device 202, having three contiguous transistor segments 207a, 207b, and 207c. As seen in FIG. 3B, the employment of the segmented transistor 208e within the pre-existing configuration of cells C1–C5 creates regions 211 of unused overhead space, which is not used by the cells C1–C5, but which may be employed for other components within the device 202. Comparing FIGS. 2B and 3B, it is noted that the area of the regions 211 in the device 202 is significantly smaller than that of the unused space in regions 120 in the device 102 above. Thus, it will be appreciated that the transistor devices 208 of the current invention provide significant layout and space utilization advantages over the elongated transistors 108 in the approach of FIGS. 2A and 2B, as well as improvements over the near-unity aspect ratio transistors 8 in FIGS. 1A and 1B. Other factors may be taken into account in determining where the segments of the transistors 208 will be located, for example, including interconnections between the cells C1–C5, the location of thermally sensitive components within the cells C1–C5, and spacing between adjacent power transistors 208 to facilitate lateral thermal diffusion for device cooling.

Figure 3C:
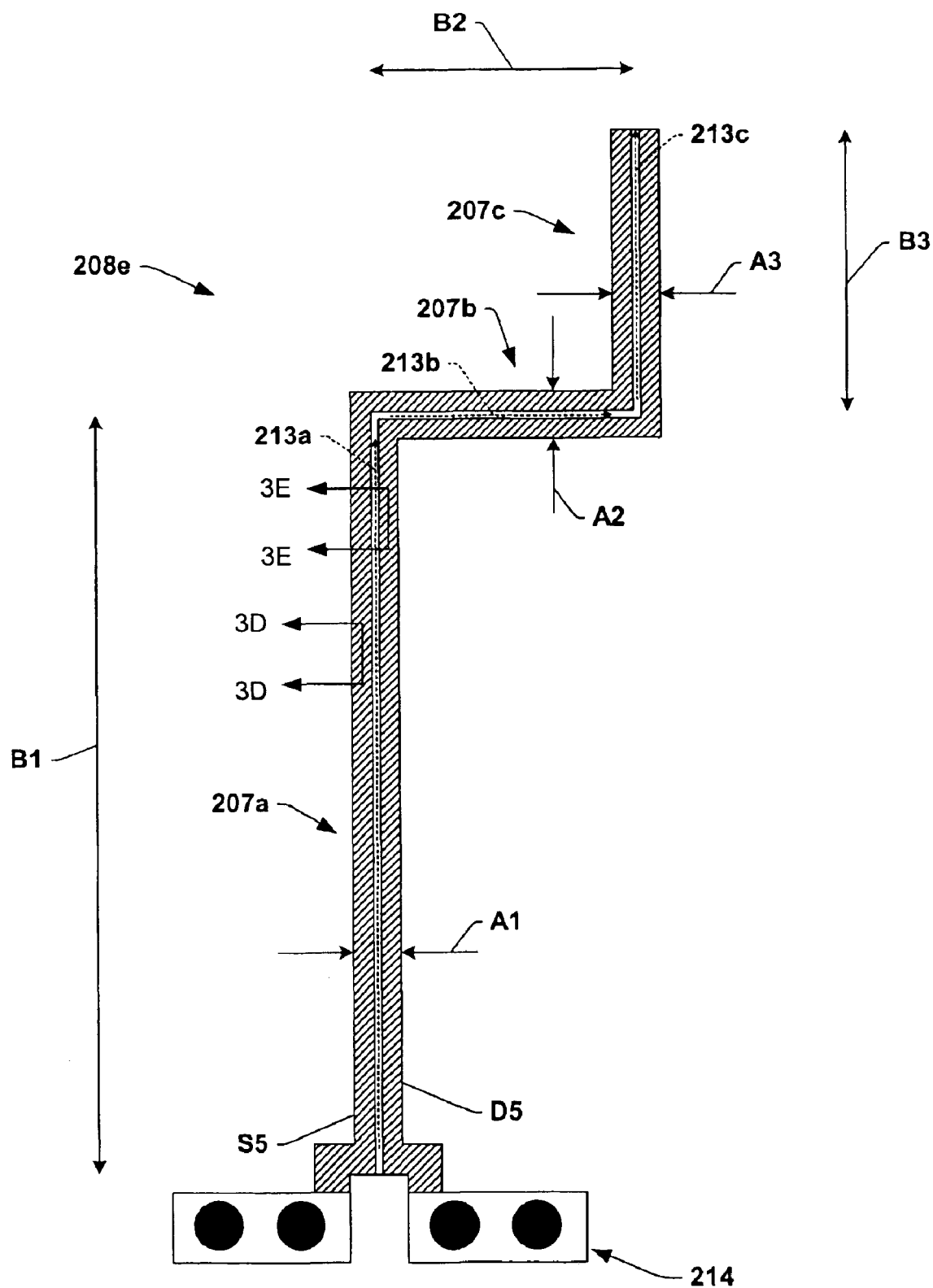

Referring also to FIG. 3C, the exemplary segmented transistor 208e provides a high effective or overall aspect ratio to facilitate scaling the total transistor area while maintaining thermal SOA performance. It is noted in this respect that scaling the power transistor devices 208 may further efforts to scale or reduce the size of the solenoid driver device 202 generally. The exemplary LDMOS transistor 208e comprises first, second, and third transistor segments 207a, 207b, and 207c, oriented along corresponding straight segment axes 213a, 213b, and 213c, respectively. In the device 208e, the segments 207a–207c are non-coaxial, wherein the axis 213b is generally perpendicular to the other segment axes 213a and 213c. The effective aspect ratio for the transistor 208e is computed as the sum of long segment dimensions (e.g., B1+B2+B3) divided by the short dimension for the case where A1=A2=A3, yielding an overall aspect ratio of about 25 for the transistor 208e. Other high (e.g., nonunity) aspect ratio transistor devices are contemplated within the scope of the invention, for example, such as effective aspect ratios greater than about 5, and greater than about 10 in other possible implementations, wherein the short dimensions of the individual segments need not be equal.

Figure 3D:
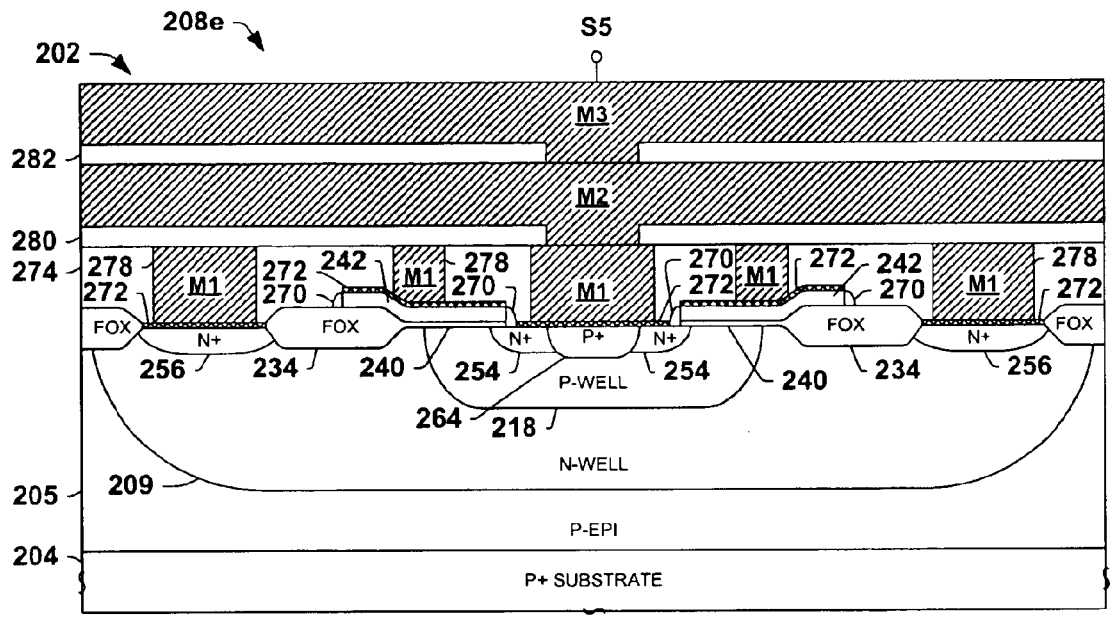
FIGS. 3D and 3E are partial side elevation views in section taken along lines 3D—3D and 3E—3E of FIG. 3C, respectively, illustrating portions of one exemplary segmented transistor device in accordance with the present invention.
Figure 3E:
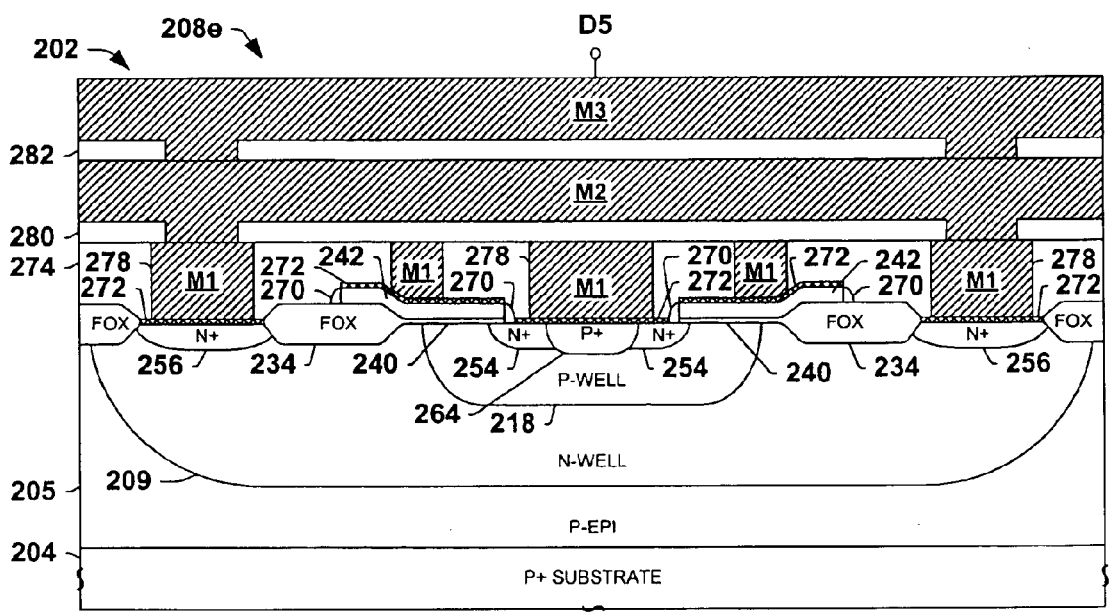
Figure 3F:
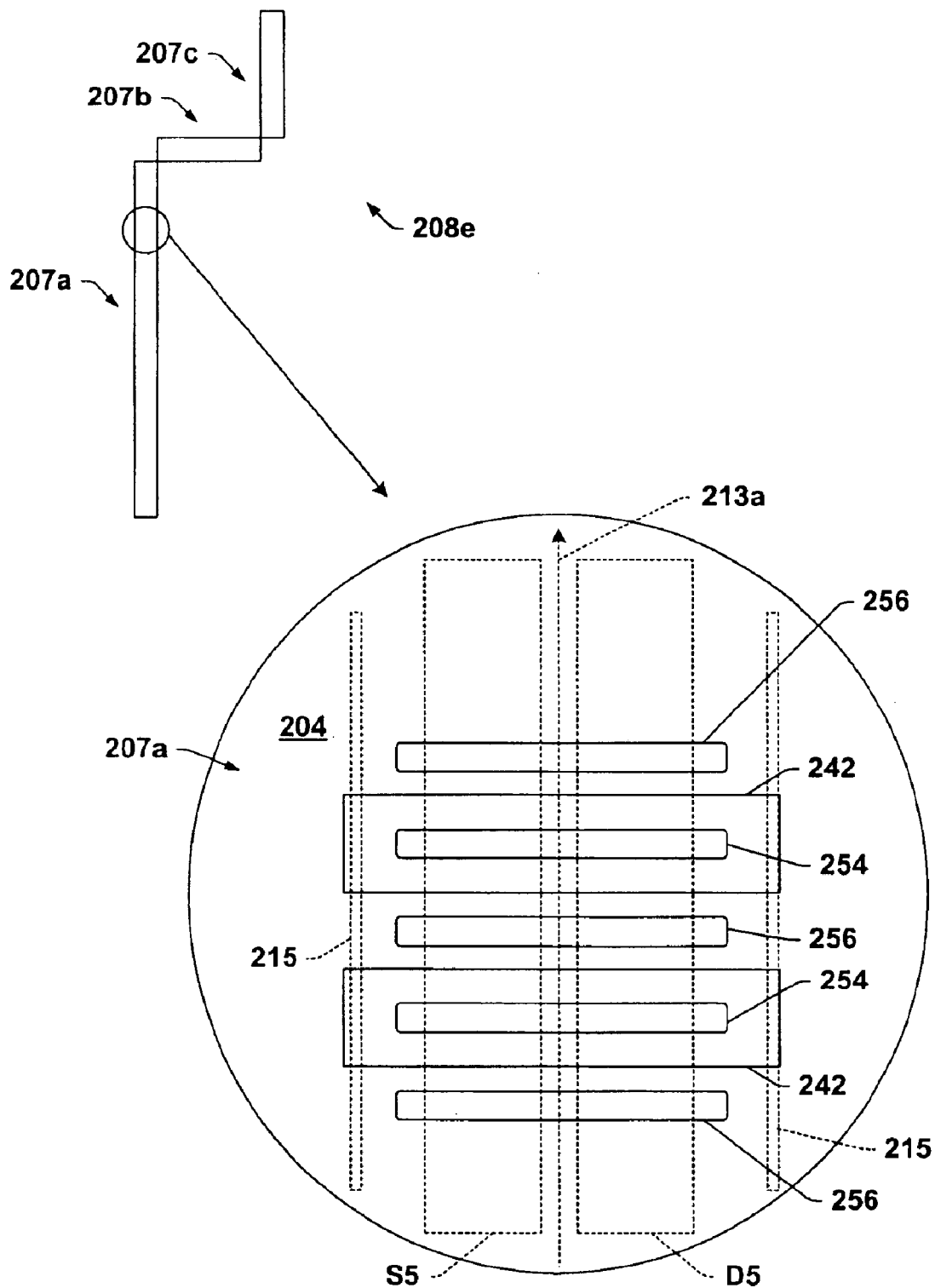
FIG. 3F is a simplified top plan view illustrating a portion of one of the transistor segments in the segmented transistor device of FIGS. 3A–3E.

Referring now to FIGS. 3C–3F, one or more of the transistor segments 207 may be partitioned. FIGS. 3D and 3E provide cross-sectional side elevation views taken along lines 3D—3D and 3E—3E, respectively, of the transistor 208e in FIG. 3C, and FIG. 3F illustrates an exploded top view of a portion of the partitioned transistor segment 207a. The segment 207a comprises a plurality of source regions 254 and drain regions 256 formed in a semiconductor body of the wafer 204, which may be silicon or other semiconductor, or an SOI wafer. The source and drain regions 254 and 256 comprise dopants implanted into the semiconductor body, such as phosphorus, arsenic or other n-type dopants for an n-channel device, or boron, indium, or other p-type dopants for a p-channel transistor 208. The segment 207a also comprises a plurality of gate structures 242, such as polysilicon overlying a thin gate dielectric material formed over channel regions of the semiconductor body between the source and drain regions 254 and 256, where the gate structures 242 in the exemplary device 202 extend laterally around the source regions 254.

In the exemplary partitioning of the transistor segment 207a, the source regions 254, the drain regions 256, and the gate structures 242 extend laterally on opposite sides of the segment axis 213a, whereas the overlying conductive source and drain metalization interconnect structures S5 and D5, respectively, extend generally parallel with the segment axis 213a (shown in phantom in FIG. 3F). As illustrated in FIGS. 3D and 3E, the source and drain interconnect structures S5 and D5 couple the source regions 254 and the drain regions 256, respectively, of the segment 207a and the other segments 207 to provide a contiguous segmented transistor device 208e. The gate structures 242 of the segment 207a are coupled with one another and those of the other segments 207b and 207c via conductive gate interconnect structures 215 (FIG. 3F) routed along the lateral ends of the segment 207a. Similar partitioning may also be employed in the other segments 207b and/or 207c. The interconnection of the sources, drains, and gates of the partitioned sections may be formed using any suitable conductive materials, such as copper, aluminum, tungsten, etc., for example, using a multi-layer or multi-level interconnect structure with conductive structures being formed in layers of dielectric materials using suitable damascene or other metalization techniques.

As illustrated in FIGS. 3D and 3E, the transistor 208e is illustrated as a partitioned, segmented, LDMOS device 208e, although other forms of LDMOS transistors, and other transistor types may be provided in accordance with the invention. The exemplary LDMOS transistors 208 of the driver device 202 are formed starting with a p+silicon substrate or other semiconductor body of the wafer 204 over which a p-type epitaxial layer 205 is formed. An n-well 209 is implanted with n-type dopants and p-type dopants are provided to a p-well 218 within the n-well 209, where the wells 209 and/or 218 may be thermally diffused to drive the implanted dopants deeper into the epitaxial layer 209. Field oxide isolation structures 234 are then formed between prospective active regions of the device 202 using LOCOS or STI processing techniques, wherein some of the field oxide structures 234 in the illustrated portion of the device 202 also provide a thick dielectric used in forming the LDMOS gate structures.

Transistor gate structures are then constructed, including a thin gate oxide layer 240 grown over the wafer surface and a layer of polysilicon 242 deposited over the gate dielectric 240. The gate polysilicon 242 is then patterned to define the gate structures for the partitioned transistor 208e, and a source/drain implantation provides n-type dopants into the source and drain regions 254 and 256, respectively, (p-type dopants for a p-channel transistor). The shared source regions 254 are formed in the p-wells 218 and the drain regions 256 are formed in the n-well 209 at a first end of the thick dielectric 234. Another p-type implantation is then employed to form a p-type back-gate contact region 264 in the p-well 218 disposed between ends of the source region 254. Thereafter, back end processing is performed, including formation of sidewall spacers 270 along the lateral sidewalls of the gate structures, as well as silicide processing to form conductive silicide 272 over the gate polysilicon 242, the source regions 254, the back-gate contacts 264, and the drain regions 256.

An initial interlayer or inter-level dielectric (ILD0) material 274 is deposited over the wafer 204 and conductive contacts 278 (e.g., tungsten or other conductive material) are then formed through the dielectric 274 in a first metalization level or layer M1 to couple with the silicided gate terminals, drain terminals, and combined source/back-gate contacts of the finished LDMOS transistor. Subsequent interconnect levels are formed over the ILD0 dielectric using dielectric layers 280 and 282 (e.g., ILD1 and ILD2, respectively), in which damascene type interconnect structures M2 and M3 are formed from copper or other conductive material to provide the source and drain routing structures S5 and D5 for the transistor 208e. In the exemplary device 202, the M2 and M3 levels are used to provide low-resistance parallel interconnect structures for the transistor source and drain, with the gate connection being routed in any of the metalization layers. Other forms of interconnections may be used in accordance with the invention, wherein the resistance of the source and drain interconnections are advantageously low to facilitate low Rdson performance for the resulting transistors 208.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A MOSFET transistor device, comprising:
a first transistor segment extending along a first axis; including a plurality of first source regions formed in a semiconductor body, the first source regions extending on laterally opposite sides of the first axis;
   a plurality of first drain regions formed in the semiconductor body, the first drain regions extending on laterally opposite sides of the first axis;
   a plurality of first gate structures formed over a plurality of channel regions in a semiconductor body, the first gate structures extending on laterally opposite sides of the first axis;
   a conductive first source interconnect structure extending generally parallel with the first axis from a first end to a second end of the first transistor segment, the first source interconnect structure being electrically coupled with the plurality of first source regions in the semiconductor body; and
   a conductive first drain interconnect structure extending generally parallel with the first axis from the first end to the second end of the first transistor segment, the first drain interconnect structure being electrically coupled with the plurality of first drain regions in the semiconductor body; and
a second transistor segment extending along a second axis; wherein the first and second transistor segments are contiguous, the first axis and the second axis are not collinear.

2. The transistor device of claim 1, wherein the first axis and the second axis are perpendicular.

3. The transistor device of claim 2, wherein at least one of the first axis and the second axis is straight.

4. The transistor device of claim 1, wherein the second transistor segment comprises:
   a plurality of second source regions formed in a semiconductor body, the second source regions extending on laterally opposite sides of the second axis;
   a plurality of second drain regions formed in the semiconductor body, the second drain regions extending on laterally opposite sides of the second axis;
   a plurality of second gate structures formed over channel regions of the semiconductor body, the second gate structures extending on laterally opposite sides of the second axis;
   a conductive second source interconnect structure extending generally parallel with the second axis from a first end to a second end of the second transistor segment, the second source interconnect structure being electrically coupled with the plurality of second source regions in the semiconductor body; and
   a conductive second drain interconnect structure extending generally parallel with the second axis from the first end to the second end of the second transistor segment, the second drain interconnect structure being electrically coupled with the plurality of second drain regions in the semiconductor body.

5. The transistor device of claim 1, wherein the transistor device has an effective aspect ratio greater than about 5.

6. The transistor device of claim 1, wherein the transistor device has an effective aspect ratio greater than about 10.

7. A MOSFET transistor device comprising:
source members, gate members, and drain members disposed near a surface of a semiconductor wafer, each gate member adjacent to a source member and a drain member;
contiguous first and second segments of a first conductive member connecting the source members electrically;
contiguous first and second segments of a second conductive member connecting the drain members electrically;
contiguous first and second segments of a third conductive member connecting the gate members electrically; and
wherein the first segments of the conductive members are substantially parallel and the second segments of the conductive members are substantially parallel; and
the first segment and the second segment of the first conductive member are not collinear.

8. The MOSFET transistor device of claim 7, wherein the first conductive member further includes a third segment connecting the source members and the third segment is contiguous to and not collinear with the second segment of the first conductive member.

9. The MOSFET transistor device of claim 7, further comprising circuit-blocks.

10. The MOSFET transistor device of claim 9, in which a circuit-block comprises a digital circuitry.

11. The MOSFET transistor device of claim 9, in which a circuit-block comprises an analog circuitry.

12. The MOSFET transistor device of claim 9, in which a circuit-block comprises bipolar devices.

13. The MOSFET transistor device of claim 10, in which the digital circuitry comprises microprocessors, A/D converters, or their combinations.

14. The MOSFET transistor device of claim 11, in which the analog circuitry comprises op-amps, comparators, bandgap voltage references, A/D converters, or their combinations.

15. The MOSFET transistor device of claim 7, further comprising parasitic bipolar transistor circuitry.

16. The MOSFET transistor device of claim 11, further comprising a LMOS transistor.

17. The MOSFET transistor device of claim 9, in which the first and the second segments of the first conductive member are interspersed between circuit-blocks.

18. A bipolar transistor device comprising:
emitter members, base members, and collector members disposed near a surface of a semiconductor wafer wherein each base member is adjacent to a emitter member and a collector member;
contiguous first and second segments of a first conductive member connecting the emitter members electrically;
contiguous first and second segments of a second conductive member connecting the base members electrically; and
contiguous first and second segments of a third conductive member connecting the drain members electrically; and
wherein the first segments of the conductive members are substantially parallel and the second segments of the conductive members are substantially parallel;
and the first segment and the second segment of the first conductive member are not collinear.

19. The bipolar transistor device of claim 18, wherein the first conductive member further includes a third segment connecting the emitter members and the third segment is contiguous to and not collinear with the second segment of the first conductive member.

20. The bipolar transistor device of claim 18, further comprising circuit-blocks of analog and digital circuitry, and the first and second segments of the first conductive member interspersed between the circuit-blocks.

* * * * *